United States Patent
Miki (10) Patent No.: US 10,207,283 B2
(45) Date of Patent: Feb. 19, 2019

(54) VANE COATING APPARATUS

(71) Applicant: IHI CORPORATION, Koto-ku (JP)

(72) Inventor: Hideyuki Miki, Koto-ku (JP)

(73) Assignee: IHI CORPORATION, Koto-ku (JP)

( * ) Notice: Subject to any disclaimer, the term of this patent is extended or adjusted under 35 U.S.C. 154(b) by 0 days.

(21) Appl. No.: 15/622,747

(22) Filed: Jun. 14, 2017

(65) Prior Publication Data

US 2017/0274403 A1    Sep. 28, 2017

Related U.S. Application Data

(63) Continuation of application No. PCT/JP2015/079349, filed on Oct. 16, 2015.

(30) Foreign Application Priority Data

Mar. 13, 2015 (JP) .................... 2015-050305

(51) Int. Cl.
| | | |
|---|---|---|
| B05B 15/04 | (2006.01) | |
| B05B 12/28 | (2018.01) | |
| B05B 12/16 | (2018.01) | |
| B05B 12/20 | (2018.01) | |
| B05B 12/22 | (2018.01) | |

(Continued)

(52) U.S. Cl.
CPC .............. B05B 12/28 (2018.02); B05B 12/16 (2018.02); B05B 12/20 (2018.02); B05B 12/22 (2018.02); B05B 13/0285 (2013.01); F01D 5/28 (2013.01); F01D 9/02 (2013.01); F01D 25/00 (2013.01); F02C 7/00 (2013.01); F02C 7/30 (2013.01); B05B 13/0242 (2013.01);

(Continued)

(58) Field of Classification Search
None
See application file for complete search history.

(56) References Cited

U.S. PATENT DOCUMENTS

| | | | |
|---|---|---|---|
| 6,296,705 B1 | 10/2001 | Ireland et al. | |
| 6,355,103 B1 * | 3/2002 | Inaba | ............ B05B 12/20 118/504 |

(Continued)

FOREIGN PATENT DOCUMENTS

| | | |
|---|---|---|
| CN | 102872999 A | 1/2013 |
| JP | 59-146080 U | 9/1984 |

(Continued)

*Primary Examiner* — Binu Thomas
(74) *Attorney, Agent, or Firm* — Oblon, McClelland, Maier & Neustadt, L.L.P.

(57) ABSTRACT

A coating apparatus includes a jig supporting a guide vane equipped with a metal sheath covering a leading edge portion; a nozzle spraying paint onto a vane body; a robot moving the nozzle; and a control unit controlling a spraying operation of the nozzle and robot. The jig includes a movable covering body adapted separably covering the metal sheath and covering an exposed portion of adhesive between a lateral edge portion of the metal sheath and the vane surface of the vane body, and a covering body drive unit moving the movable covering body between a state in which the movable covering body covers the metal sheath and a state in which the movable covering body is separated from the metal sheath while covering the metal sheath. The control unit performs control to make transition from a sheath cladding coating mode to a finish coating mode.

2 Claims, 7 Drawing Sheets

(51) Int. Cl.
- *F01D 5/28* (2006.01)
- *F01D 25/00* (2006.01)
- *F02C 7/00* (2006.01)
- *F02C 7/30* (2006.01)
- *B05B 13/02* (2006.01)
- *F01D 9/02* (2006.01)
- *C23C 14/04* (2006.01)
- *B05B 15/14* (2018.01)
- *B05B 13/04* (2006.01)

(52) U.S. Cl.
CPC .......... *B05B 13/0431* (2013.01); *B05B 15/14* (2018.02); *C23C 14/044* (2013.01); *F05D 2230/90* (2013.01)

(56) References Cited

U.S. PATENT DOCUMENTS

| | | |
|---|---|---|
| 2003/0049131 A1 | 3/2003 | Murakami et al. |
| 2008/0187676 A1* | 8/2008 | Blankenship ....... B05B 13/0431 118/300 |
| 2014/0157595 A1 | 6/2014 | Trzcinski et al. |
| 2014/0329001 A1 | 11/2014 | Rouaud et al. |
| 2014/0329013 A1* | 11/2014 | Rouaud .................. B05B 12/20 118/695 |
| 2015/0217316 A1* | 8/2015 | Brett ...................... B05B 12/22 118/712 |

FOREIGN PATENT DOCUMENTS

| | | |
|---|---|---|
| JP | 10-118564 A | 5/1998 |
| JP | 2001-41002 | 2/2001 |
| JP | 2001-205153 | 7/2001 |
| RU | 133 128 U1 | 10/2013 |
| WO | WO 2014/023439 A1 | 2/2014 |
| WO | WO 2015/175086 A1 | 11/2015 |

* cited by examiner

VANE COATING APPARATUS

This application is a Continuation of PCT/JP2015/079349 of Oct. 16, 2015.

TECHNICAL FIELD

Embodiments described herein relate to a vane coating apparatus suitable for applying an anti-erosion coating, for example, to stator vanes and rotor blades of a turbofan engine.

BACKGROUND ART

A turbofan engine conventionally includes rotor blades adapted to introduce air into an engine body and guide vanes, which are stator vanes adapted to straighten flow of air introduced by the rotor blades.

To meet a demand for an increased bypass ratio intended to improve fuel economy of recent turbofan engines, fan diameter tends to become larger, and consequently it is urgent to reduce weight of the turbofan engines.

For example, there are attempts to reduce the weight of the guide vanes themselves, which are stator vanes adapted to straighten flow of air, by using composite vanes made of a composite material of a thermosetting resin such as an epoxy resin and reinforcement fibers such as carbon fibers or light-metal vanes made of a light metal such as aluminum.

The guide vanes made of a composite material or a relatively soft metal such as aluminum are inferior in erosion resistance and shock resistance. Thus, to avoid wear, a metal sheath of hard material is bonded with adhesive to leading edge portions (leading edges and their vicinities) especially subject to wear due to head-on collisions with particles such as sand or pebbles (see, for example, Patent Document 1).

Of the guide vanes made of such a composite material or light metal, vane surfaces (vane surfaces excluding a metal sheath bonded to the leading edge portions) of vane bodies hit obliquely by particles such as sand or pebbles at shallow angles are coated, for example, with a soft polyurethane paint which has excellent erosion resistance against collisions of particles at shallow angles and is lighter than metal.

RELATED ART DOCUMENT

Patent Document

Patent Document 1: Japanese Patent Laid-Open No. 2001-041002

SUMMARY OF THE DISCLOSURE

Problems to be solved by the Disclosure

When an anti-erosion coating is applied to the vane surfaces of the vane bodies of the guide vanes described above, lateral edge portions of the metal sheath are covered with masking tapes. However, if masking tapes are used in this way, anti-erosion paint is laminated more thickly in a vane thickness direction than in the lateral edge portions of the metal sheath, and when the masking tapes are removed, a height difference is left between the lateral edge portions of the metal sheath and a paint layer.

The height difference can cause pressure loss which adversely affects aerodynamic performance of the vanes, making correction work indispensable. Thus, a conventional problem to be solved is how to keep down the height difference.

An object of the present disclosure is to provide a vane coating apparatus which, when applying anti-erosion coating, can prevent a height difference which will adversely affect aerodynamic performance of a vane from being produced in a boundary portion between a lateral edge portion of a metal sheath and a paint layer formed on a vane surface in the vicinity of the lateral edge portion.

Means for solving the Problems

In order to achieve the above object, a first aspect of the present disclosure is directed to providing a coating apparatus for a vane which includes a vane body made of a composite material of a thermosetting resin or thermoplastic resin and reinforcement fibers or made of a light metal such as aluminum, and a metal sheath for covering a leading edge portion of the vane body, the coating apparatus including: a jig which supports the vane; a nozzle which sprays paint onto a vane surface of the vane body except for the metal sheath of the vane supported by the jig; a robot which moves the nozzle; and a control unit which controls a paint spraying operation of the nozzle and the robot, wherein the jig includes a movable covering body which covers the metal sheath by separably overlapping the metal sheath and covers a boundary portion between a lateral edge portion of the metal sheath and the vane surface of the vane body, and a covering body drive unit which moves the movable covering body between a state in which the movable covering body covers the metal sheath and the boundary portion and a state in which the movable covering body is separated from the metal sheath while covering the metal sheath and the boundary portion, and the control unit performs control to make a transition from a sheath cladding coating mode in which paint is sprayed onto the entire vane surface of the vane body by operating the nozzle and the robot with the metal sheath and the boundary portion being covered with the movable covering body to a finish coating mode in which paint is sprayed over the movable covering body onto at least the boundary portion out of the lateral edge portion of the metal sheath and the boundary portion by operating the nozzle and the robot with the movable covering body separated from the metal sheath by the covering body drive unit.

Effects of the Disclosure

According to the present disclosure, when applying anti-erosion coating, the vane coating apparatus brings about a very excellent effect of being able to prevent a height difference which will adversely affect aerodynamic performance of the vane from being produced in the boundary portion between the lateral edge portion of the metal sheath and the paint layer formed on the vane surface in the vicinity of the lateral edge portion.

MODE FOR CARRYING OUT THE DISCLOSURE

The present disclosure will be described below with reference to the accompanying drawings.

FIGS. 1 to 7 show an embodiment of a vane coating apparatus according to the present disclosure. In this embodiment, vanes are guide vanes made of a composite material of a thermosetting resin or a thermoplastic resin and reinforcement fibers.

Figure 1:
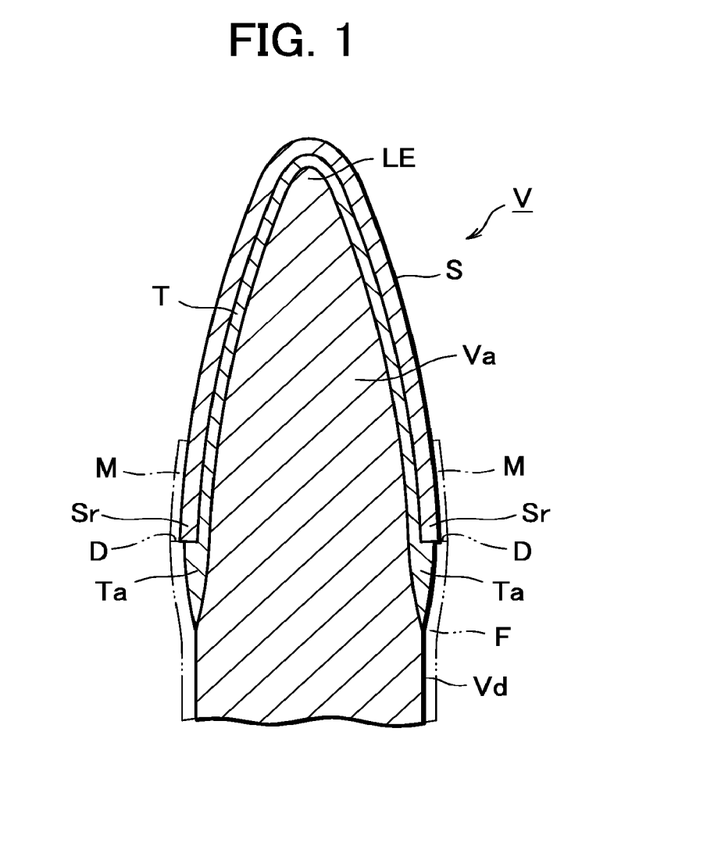
FIG. 1 is an explanatory enlarged sectional view of a leading edge portion of a guide vane to which anti-erosion coating is applied by a vane coating apparatus according to an embodiment of the present disclosure.

As shown in FIG. 1, a guide vane V is a composite vane used as a stator vane of a turbofan engine. A leading edge portion LE of a vane body Va hit head-on by particles such as sand or pebbles is covered with a metal sheath S of hard material resistant to erosion. The metal sheath S is made, for example, of a titanium alloy about 0.2 mm in thickness and is attached to the vane body Va using an adhesive T.

Meanwhile, a vane surface Vd (portion of vane surface excluding the metal sheath S bonded to the leading edge portion LE) of the vane body Va hit obliquely by particles such as sand or pebbles at shallow angles is coated with a paint F (indicated by a chain double-dashed line) such as a polyurethane paint or an epoxy paint which has excellent erosion resistance against collisions of particles at shallow angles and is lighter than metal.

In coating the vane surface Vd of the vane body Va, if the paint F is simply sprayed onto the entire vane surface Vd of the vane body Va and exposed adhesive portions Ta (portions in which the adhesive T is exposed between a lateral edge portion Sr of the metal sheath S and the vane surface Vd (boundary portions)) by covering the lateral edge portion Sr of the metal sheath S, for example, with masking tapes M as indicated by an alternate long and short dash line, when the masking tapes M are removed, a height difference D which can cause pressure loss will be left between the lateral edge portion Sr of the metal sheath S and a layer of the paint F.

Figure 2:
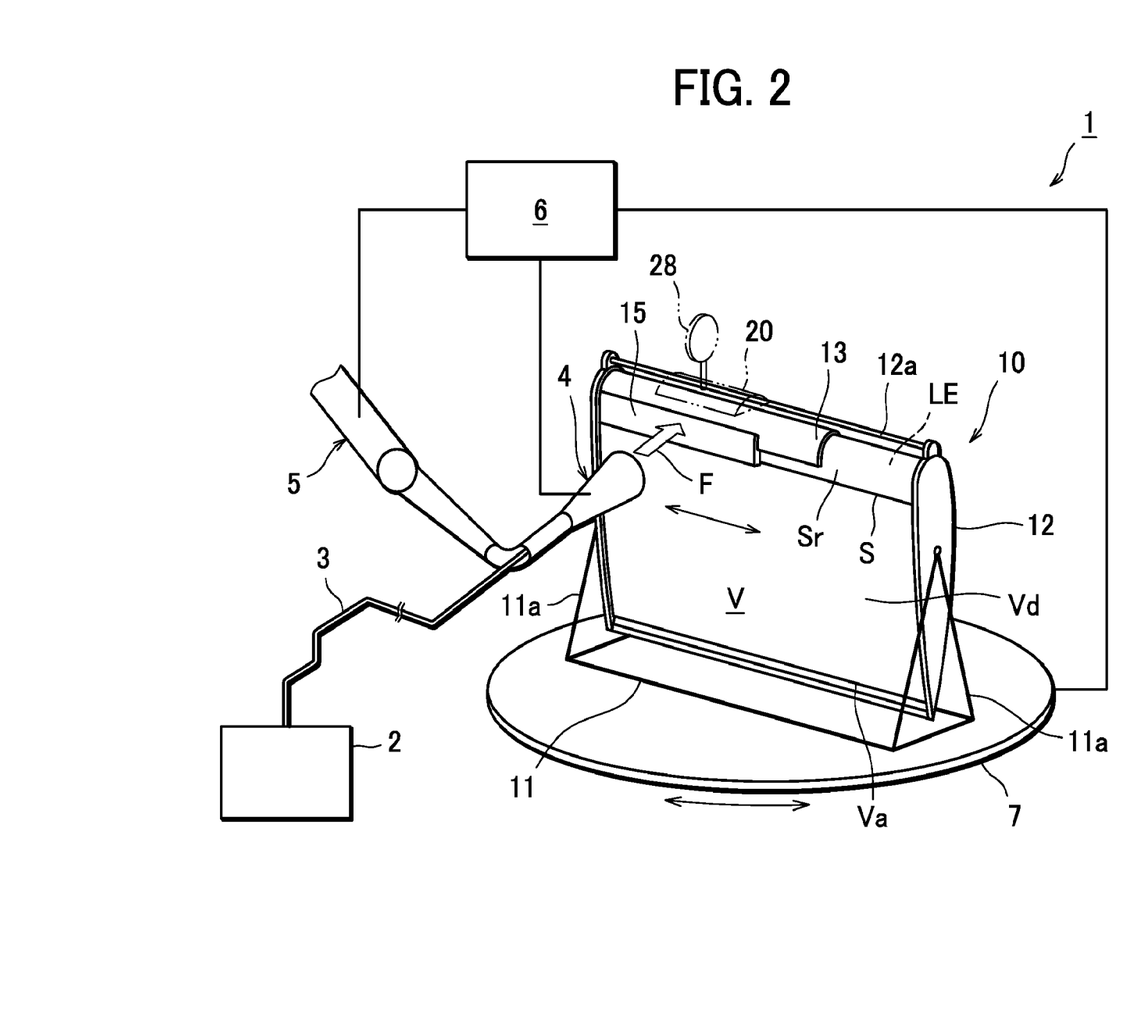
FIG. 2 is an explanatory schematic configuration diagram of the vane coating apparatus according to the embodiment of the present disclosure.

A coating apparatus 1 performing anti-erosion coating so as to keep down the height difference D includes, as shown in FIG. 2, a jig 10 adapted to support the guide vane V; a nozzle 4 adapted to spray the paint F onto the vane surface Vd of the vane body Va except for the metal sheath S of the guide vane V supported by the jig 10, the paint F being supplied from a paint supply source 2 through a hose 3; a robot 5 adapted to move the nozzle 4 so as to spray the paint F onto the entire vane surface Vd of the vane body Va; and a control unit 6 adapted to control an operation of spraying of the paint F by the nozzle 4 and the robot 5.

The jig 10 is installed on a rotating table 7 and equipped with a stand 11 having a pair of legs 11a, 11a and a frame 12 adapted to support the guide vane V by surrounding the guide vane V between the legs 11a, 11a of the stand 11.

Figure 3:
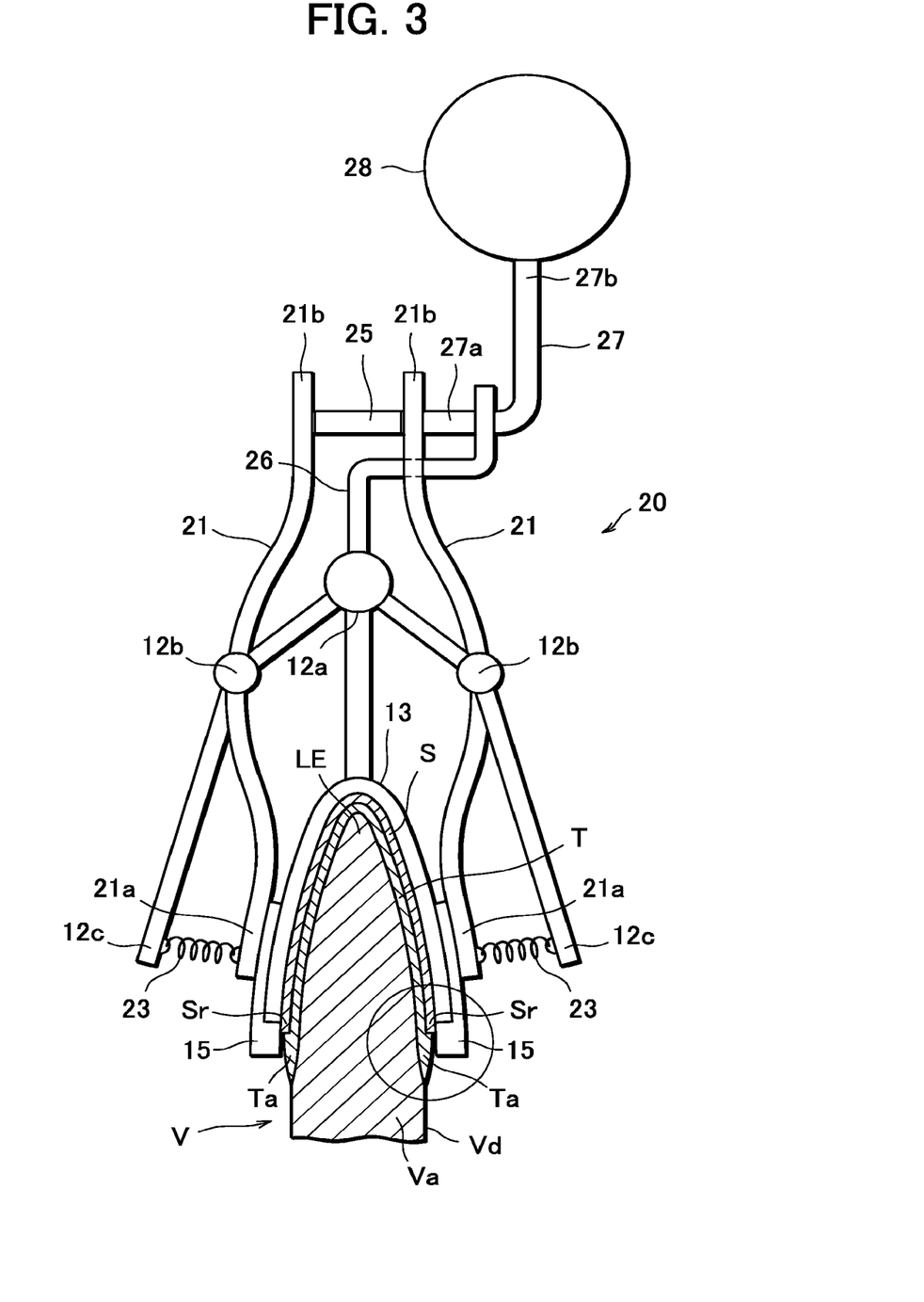
FIG. 3 is an explanatory partial sectional view showing a covering body drive unit in sheath cladding coating mode of the coating apparatus of FIG. 2.

In addition, as also shown in FIG. 3, the jig 10 includes a sheath covering body 13 adapted to cover the metal sheath S, and the sheath covering body 13 is coupled to an upper frame 12a of the frame 12.

Figure 4A:
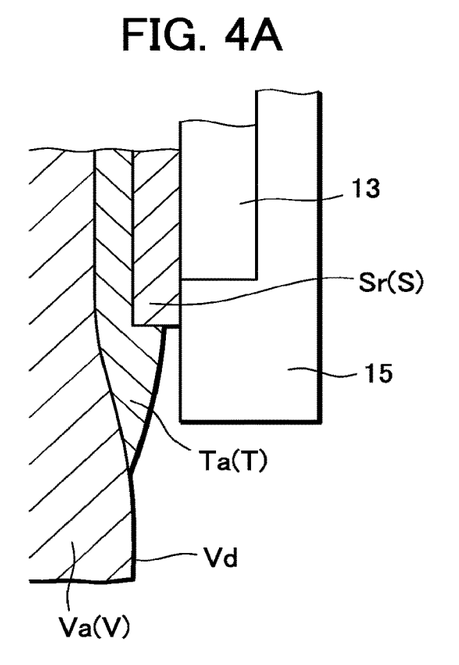
FIG. 4A is an explanatory enlarged sectional view of the circled portion of FIG. 3, showing how a metal sheath is covered by a movable covering body.

Furthermore, as also shown in FIG. 4A, the jig 10 includes a pair of movable covering bodies 15, 15 adapted to cover the lateral edge portions Sr, Sr by separably overlapping the lateral edge portions Sr, Sr of the metal sheath S, the lateral edge portions Sr, Sr being not covered with the sheath covering body 13, as well as to cover the exposed adhesive portions Ta, Ta (boundary portions) between the lateral edge portions Sr, Sr and the vane surface Vd of the vane body Va; and a covering body drive unit 20 adapted to move the movable covering bodies 15, 15.

The covering body drive unit 20 includes a pair of arms 21, 21. Respective central portions of the pair of arms 21, 21 are rotatably supported by respective shafts 12b, 12b extending in a direction along the upper frame 12a of the frame 12, and respective first end portions 21a, 21a of the pair of arms 21, 21 are coupled with the movable covering bodies 15, 15, respectively.

The pair of arms 21, 21 make up a locking mechanism, and a stopper 25 which makes up the locking mechanism together with the arms 21, 21 is positioned between respective second end portions 21b, 21b of the arms 21, 21, maintaining a covered state in which both lateral edge portions Sr, Sr of the metal sheath S as well as the exposed adhesive portions Ta, Ta are covered by the movable covering bodies 15, 15.

Also, the covering body drive unit 20 includes an L-shaped rod 27 pivotally supported by bearing fittings 26 fixed to the upper frame 12a of the frame 12, and the stopper 25 of the locking mechanism is fixed to a short shaft portion 27a of the L-shaped rod 27 supported by the bearing fittings 26.

Figure 7:
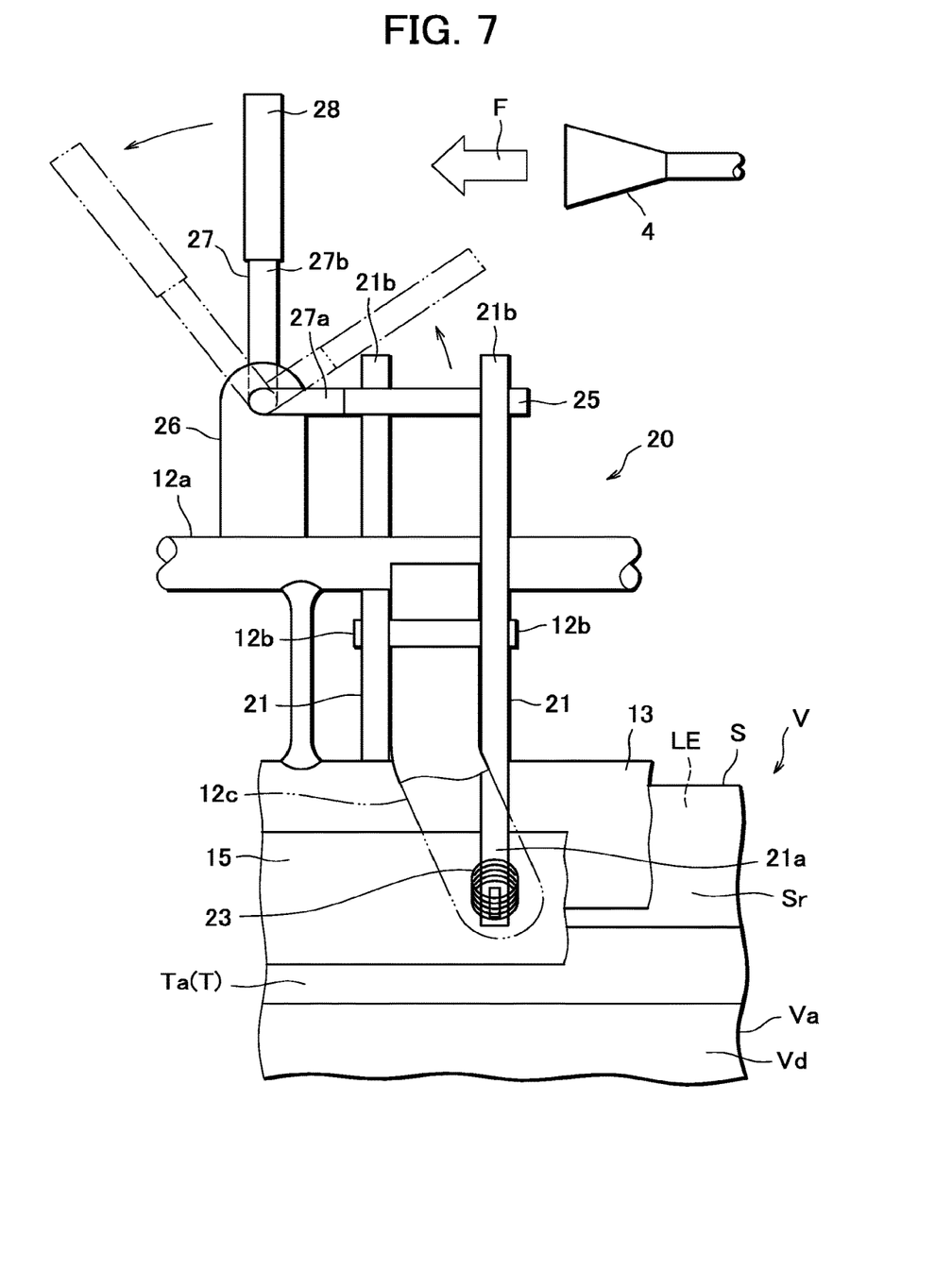
FIG. 7 is an explanatory partial front view of the covering body drive unit of the coating apparatus of FIG. 2, showing movements of a locking mechanism and unlocking mechanism when mode is switched from the sheath cladding coating mode of FIG. 3 to the finish coating mode of FIG. 5.

The L-shaped rod 27 makes up an unlocking mechanism and a pressure receiving body 28 which makes up the unlocking mechanism together with the L-shaped rod 27 is fixed to a tip of a long shaft portion 27b of the L-shaped rod 27. As shown in FIG. 7, the pressure receiving body 28 is designed to pivot the L-shaped rod 27 by receiving the paint F (or air) ejected from the nozzle 4 and make the stopper 25 of the locking mechanism pull out from between the second end portions 21b, 21b of the pair of arms 21, 21.

That is, by spraying the paint F (or air) onto the pressure receiving body 28 of the unlocking mechanism from the nozzle 4, the covering body drive unit 20 releases the covered state in which both lateral edge portions Sr, Sr of the metal sheath S as well as the exposed adhesive portions Ta, Ta are covered by the movable covering bodies 15, 15.

Furthermore, the covering body drive unit 20 includes helical extension springs 23, 23. The helical extension springs 23, 23 are placed between overhang portions 12c, 12c formed integrally on opposite sides (both right and left sides in FIG. 3) of the upper frame 12a of the frame 12 and the first end portions 21a, 21a of the pair of arms 21, 21, respectively.

Figure 5:
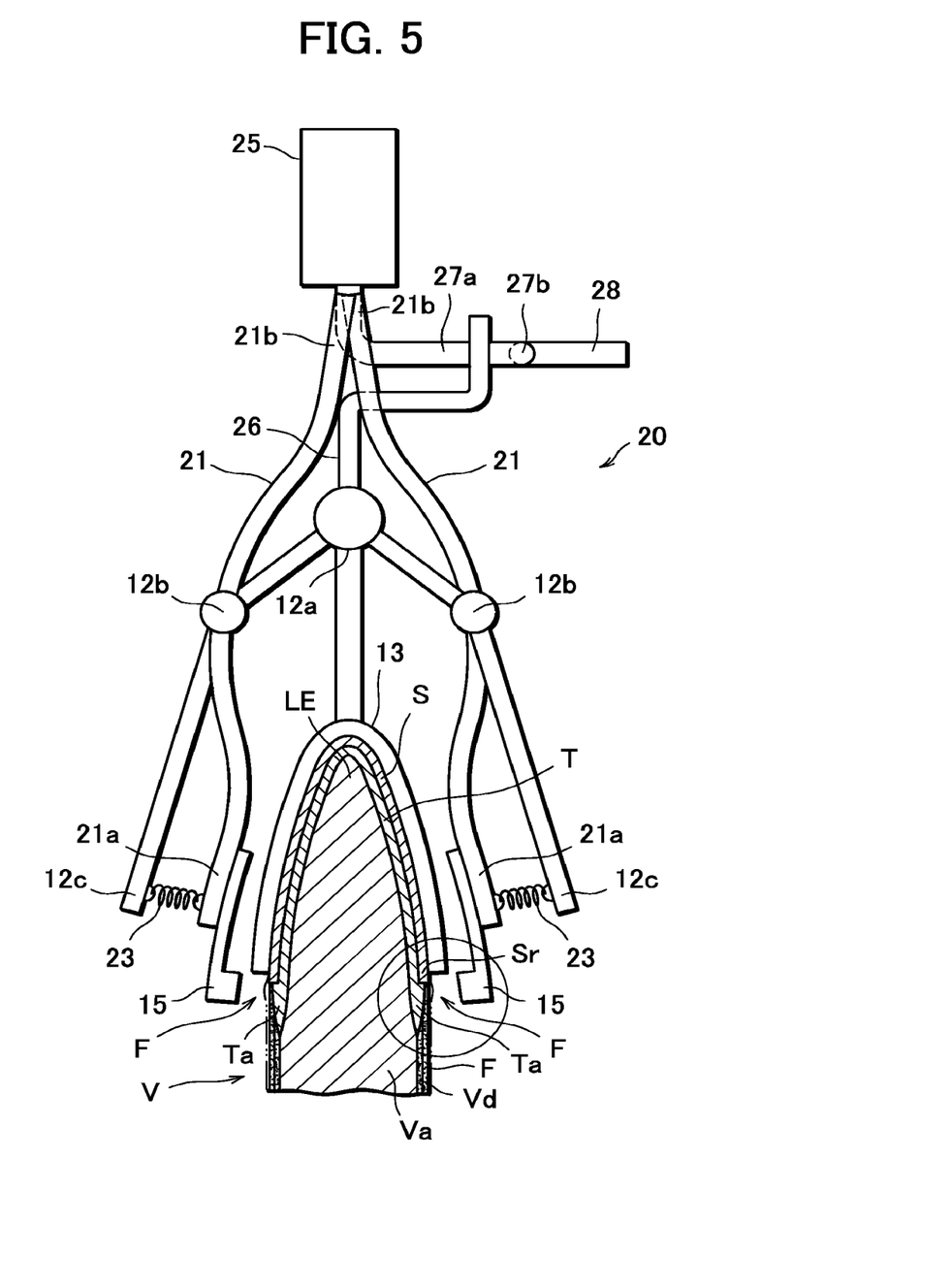
FIG. 5 is an explanatory partial sectional view showing a covering body drive unit in finish coating mode of the coating apparatus of FIG. 2.

As shown in FIG. 5, the helical extension springs 23, 23 are designed to maintain a separated state between the movable covering bodies 15, 15 and both lateral edge portions Sr, Sr of the metal sheath S by imparting a force in a direction of separating from the metal sheath S to the movable covering bodies 15, 15 released from a covered state in which both lateral edge portions Sr, Sr of the metal sheath S are covered.

In the coating apparatus 1, coating in sheath cladding coating mode and coating in finish coating mode are performed in sequence under the control of the control unit 6.

Figure 4B:
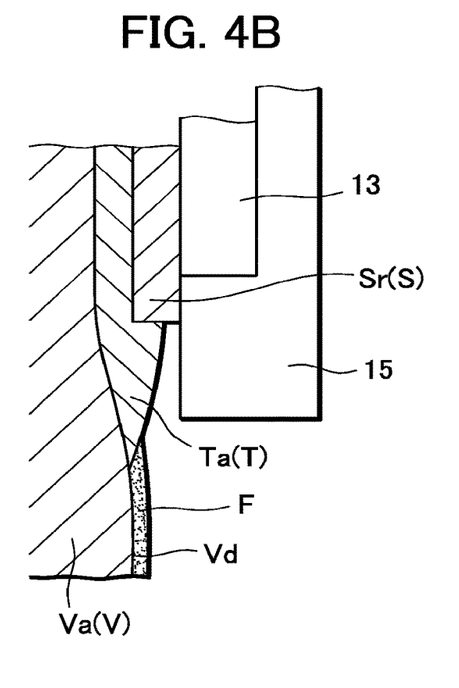
FIG. 4B is an explanatory enlarged sectional view of the circled portion of FIG. 3, showing how a paint layer is formed after coating is performed in the sheath cladding coating mode.

In the sheath cladding coating mode, as shown in FIG. 4B, in a state in which both lateral edge portions Sr, Sr of the metal sheath S as well as the exposed adhesive portions Ta, Ta are covered by the movable covering bodies 15, 15, the paint F is sprayed onto the entire vane surface Vd of the vane body Va through operation of the nozzle 4 and the robot 5.

Figure 6:
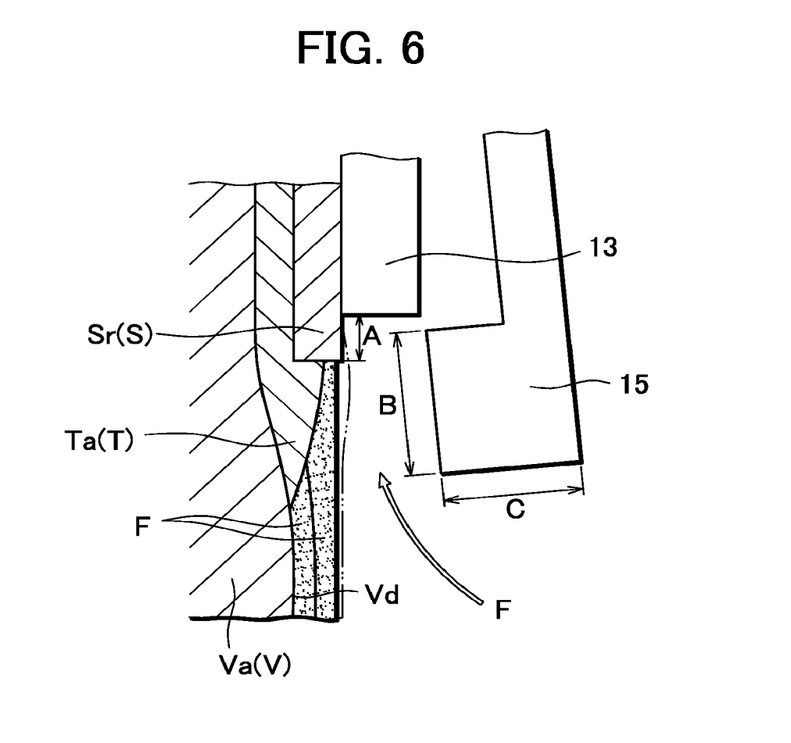
FIG. 6 is an explanatory enlarged sectional view of the circled portion of FIG. 5, showing how coating is performed in the finish coating mode after a covered state in which the metal sheath is covered with the movable covering body is released.

In the finish coating mode, as also shown in FIG. 6, with a gap formed between the movable covering bodies 15, 15 and the metal sheath S by separating the movable covering bodies 15, 15 from both lateral edge portions Sr, Sr of the metal sheath S and the exposed adhesive portions Ta, Ta, respectively, using the covering body drive unit 20, the paint F is sprayed onto the entire vane surface Vd of the vane body Va as well as sprayed over the movable covering bodies 15 onto both lateral edge portions Sr, Sr of the metal sheath S as well as the exposed adhesive portions Ta, Ta through operation of the nozzle 4 and the robot 5 (see arrows in FIGS. 5 and 6).

That is, in the finish coating mode, since the paint F sprayed in the vicinity of the lateral edge portions Sr of the metal sheath S is limited to the paint F entering the gap described above by spraying over the movable covering bodies 15, it is possible to reduce the paint F laminated on the exposed adhesive portions Ta adjacent to the lateral edge portions Sr of the metal sheath S and thereby keep down the height difference between the lateral edge portions Sr of the metal sheath S and the laminated paint F.

In the sheath cladding coating mode and the finish coating mode, a movement pattern and movement speed of the nozzle 4 moved by the robot 5 as well as an amount of the sprayed paint F per coating are set appropriately according to conditions such as required layer thickness of the paint F and number of times of coating.

In addition, length A of the lateral edge portion Sr not covered with the sheath covering body 13 out of the metal sheath S, length B of the movable covering body 15 in a vane chord direction, thickness C of the movable covering body 15, shown in FIG. 6, and other dimensions are also set appropriately according to conditions such as the vane shape of guide vane V, thickness of metal sheath S, type of the paint F, and required layer thickness of the paint F, and number of times of coating. Furthermore, spacing between the movable covering body 15 and the metal sheath S in the finish coating mode, is set appropriately according to conditions such as the layer thickness of the exposed adhesive portions Ta adjacent to the lateral edge portion Sr of the metal sheath S, number of times of coating, and viscosity of the paint F. In doing so, the spacing between the movable covering body 15 and the metal sheath S can be adjusted by replacing the helical extension spring 23 as appropriate.

Next, procedures for applying the anti-erosion coating to the vane surface Vd of the vane body Va of the guide vane V using the coating apparatus 1 according to the present embodiment will be described below.

First, as shown in FIG. 2, the guide vane V is set in the frame 12 of the jig 10 on the rotating table 7. In doing so, the metal sheath S is covered with the sheath covering body 13 coupled to the upper frame 12a of the frame 12, and the lateral edge portions Sr, Sr of the metal sheath S which are not covered with the sheath covering body 13 are covered with the pair of movable covering bodies 15, 15 placed thereon, and consequently as shown in FIGS. 3, 4A, and 7, the covered state in which both lateral edge portions Sr, Sr of the metal sheath S as well as the exposed adhesive portions Ta, Ta are covered with the pair of movable covering bodies 15, 15 is maintained by the locking mechanism of the covering body drive unit 20.

When the guide vane V has been set in the frame 12 of the jig 10, coating is started in the sheath cladding coating mode. Specifically, the nozzle 4 and the robot 5 are operated by the control unit 6 using the movement pattern and the movement speed set according to required coating conditions and a specified amount of the paint F is sprayed onto the entire vane surface Vd on a first side of the vane body Va.

The spraying of the paint F in the sheath cladding coating mode is repeated multiple times according to conditions such as required layer thickness of the paint F (a state after completion of the first spraying of the paint F is shown in FIG. 4B).

When the vane surface Vd on the first side of the vane body Va has been sprayed multiple times with the paint F in the sheath cladding coating mode, the rotating table 7 is rotated a half turn. Subsequently, coating of the vane surface Vd on a second side of the vane body Va is started in the sheath cladding coating mode and a specified amount of the paint F is sprayed onto the entire vane surface Vd on the second side of the vane body Va in the same manner as described above.

When coating of the vane surfaces Vd on both sides of the vane body Va in the sheath cladding coating mode is finished, the control unit 6 operates the nozzle 4 and the robot 5 to spray the paint F (or air) onto the pressure receiving body 28 of the unlocking mechanism of the covering body drive unit 20 as shown in FIG. 7. Consequently, the covered state in which both lateral edge portions Sr, Sr of the metal sheath S as well as the exposed adhesive portions Ta, Ta are covered with the movable covering bodies 15, 15 is released.

In this state, because a force in a direction of separating from the metal sheath S is imparted by the helical extension springs 23, 23 to the movable covering bodies 15, 15 released from the covered state in which both lateral edge portions Sr, Sr of the metal sheath S are covered, a separated state between the movable covering bodies 15, 15 and both lateral edge portions Sr, Sr of the metal sheath S is maintained, thereby completing transition to the finish coating mode.

When the coating in the sheath cladding coating mode is finished, as indicated by solid lines in FIGS. 5 and 6, the layers (two layers in the illustrated example) of the paint F on the exposed adhesive portions Ta, Ta which were covered with the movable covering bodies 15, 15 have not reached a surface level of the metal sheath S.

Next, in the finish coating mode, the nozzle 4 and the robot 5 are operated by the control unit 6 using the movement pattern and the movement speed set according to required coating conditions and a specified amount of the paint F is sprayed onto the entire vane surface Vd on the second side of the vane body Va. In doing so, a specified amount of the paint F is also sprayed over the movable covering body 15 onto both lateral edge portions Sr, Sr of the metal sheath S as well as the exposed adhesive portions Ta, Ta e a specified number of times.

When the coating of the vane surface Vd on the second side of the vane body Va in the finish coating mode is finished, the rotating table 7 is rotated a half turn again. Subsequently, the nozzle 4 and the robot 5 are operated using the movement pattern and the movement speed set according to required coating conditions, a specified amount of the paint F is sprayed onto the entire vane surface Vd on a first side of the vane body Va, and also a specified amount of the paint F is sprayed over the movable covering bodies 15 onto both lateral edge portions Sr, Sr of the metal sheath S as well as the exposed adhesive portions Ta, Ta a specified number of times.

In the finish coating mode, since amounts of the paint F sprayed to the vicinity of the lateral edge portion Sr of the metal sheath S are limited to the paint F entering the gap between the movable covering bodies 15, 15 and the metal sheath S by the spraying over the movable covering body 15, when the coating in the finish coating mode is finished, an uppermost layer of the paint F on the exposed adhesive portions Ta, Ta almost reaches the surface level of the metal sheath S as indicated by imaginary lines in FIGS. 5 and 6.

In this way, since the vane coating apparatus 1 according to the present embodiment performs not only coating in the sheath cladding coating mode, but also coating in the finish coating mode, the amounts of paint F sprayed to the vicinity of the lateral edge portions Sr of the metal sheath S are limited and the paint F laminated on the lateral edge portions Sr of the metal sheath S and the exposed adhesive portions Ta in the vicinity of the lateral edge portions Sr are decreased accordingly, thereby making it possible to prevent height differences which will adversely affect aerodynamic performance of the vane from being produced in boundary portions between the lateral edge portions Sr of the metal sheath S and the paint layers formed on the vane surface in the vicinity of the lateral edge portions Sr.

Also, in the vane coating apparatus 1 according to the present embodiment, the covering body drive unit 20 adapted to move the movable covering bodies 15, 15 includes the locking mechanism adapted to maintain the covered state in which the metal sheath S is covered with the movable covering bodies 15, 15, the unlocking mechanism adapted to terminate the covered state in which the metal sheath S is covered with the movable covering bodies 15, 15, and the helical extension springs 23 adapted to impart a force in a direction of separating from the metal sheath S to the movable covering bodies 15, 15, and thus a transition from the sheath cladding coating mode to the finish coating mode is made smoothly.

Furthermore, in the vane coating apparatus 1 according to the present embodiment, since the locking mechanism of the covering body drive unit 20 includes the stopper 25 adapted to restrict separating motion of the movable covering bodies 15, 15 from the metal sheath S and the unlocking mechanism includes the pressure receiving body 28 adapted to pivot the L-shaped rod 27 by receiving the paint F or air from the nozzle 4 and thereby lift the restriction imposed on the separating motion by the stopper 25, the covered state in which the metal sheath S is covered with the movable covering bodies 15, 15 is maintained and released smoothly and reliably without complicating a structure.

Whereas in the embodiment described above, the stopper 25 of the locking mechanism is pulled out from between the second end portions 21b, 21b of the pair of arms 21, 21 by spraying the paint F (or air) ejected from the nozzle 4 onto the pressure receiving body 28 of the unlocking mechanism, the pressure receiving body 28 may be pushed directly by the nozzle 4 itself by operating the robot 5.

Also, whereas in the embodiment described above, the paint F is sprayed onto the entire vane surface Vd of the vane body Va in the finish coating mode, this is not restrictive, and the paint F may be only sprayed over the movable covering body 15 onto at least the exposed adhesive portions Ta out of the lateral edge portions Sr of the metal sheath S and the exposed adhesive portions Ta.

Furthermore, whereas in the embodiment described above, the vane surface Vd of the vane body Va to be coated is turned toward the nozzle 4 by rotating the rotating table 7, the rotating table 7 is not strictly necessary, and the nozzle 4 may be moved toward the vane surface Vd of the vane body Va to be coated, by the robot 5.

Furthermore, whereas in the embodiment described above, description has been given by taking as an example a case in which the vane is a composite vane made of a composite material of a thermosetting resin such as an epoxy resin and reinforcement fibers such as carbon fibers, this is not restrictive, and the vane may be, for example, a light-metal vane made of a relatively soft light metal such as aluminum.

Furthermore, whereas in the embodiment described above, description has been given by taking as an example a case in which the vane is a guide vane V serving as a stator vane of a turbofan engine, this is not restrictive, and the vane may be, for example, a fan blade of a turbofan engine or a rotor blade or a tail rotor blade of a rotorcraft.

The configuration of the vane coating apparatus according to the present disclosure is not limited to the above embodiment, and other possible configurations include, for example, a configuration in which a sealing material is adhered to surfaces of the sheath covering body 13 and the movable covering bodies 15 in contact with the metal sheath S.

A first aspect of the present disclosure is a coating apparatus for a vane which includes a vane body made of a composite material of a thermosetting resin or thermoplastic resin and reinforcement fibers or made of a light metal such as aluminum, and a metal sheath for covering a leading edge portion of the vane body, the coating apparatus including: a jig which supports the vane; a nozzle which sprays paint onto a vane surface of the vane body except for the metal sheath of the vane supported by the jig; a robot which moves the nozzle; and a control unit which controls a paint spraying operation of the nozzle and the robot, wherein the jig includes a movable covering body which covers the metal sheath by separably overlapping the metal sheath and covers a boundary portion between a lateral edge portion of the metal sheath and the vane surface of the vane body, and a covering body drive unit which moves the movable covering body between a state in which the movable covering body covers the metal sheath and the boundary portion and a state in which the movable covering body is separated from the metal sheath while covering the metal sheath and the boundary portion, and the control unit performs control to make transition from a sheath cladding coating mode in which paint is sprayed onto the entire vane surface of the vane body by operating the nozzle and the robot with the metal sheath and the boundary portion being covered with the movable covering body to a finish coating mode in which paint is sprayed over the movable covering body onto at least the boundary portion out of the lateral edge portion of the metal sheath and the boundary portion by operating the nozzle and the robot with the movable covering body separated from the metal sheath by the covering body drive unit.

In a second aspect of the present disclosure, the covering body drive unit includes a locking mechanism which maintains a covered state in which the metal sheath and the boundary portion are covered with the movable covering body, an unlocking mechanism which releases the covered state of the movable covering body created by the locking mechanism and separates the movable covering body from the metal sheath, and a helical extension spring which maintains a separated state between the movable covering body and the metal sheath by imparting a force in a direction of separating from the metal sheath to the movable covering body.

In a third aspect of the present disclosure, the locking mechanism of the covering body drive unit includes a stopper which restricts separating motion of the movable covering body from the metal sheath in the covered state in which the metal sheath is covered, and the unlocking mechanism includes a pressure receiving body which operates by receiving paint or air from the nozzle and thereby lifts the restriction imposed on the separating motion by the stopper of the locking mechanism.

EXPLANATION OF REFERENCE SIGNS

1 Vane coating apparatus
4 Nozzle
5 Robot
6 Control unit
10 Jig
15 Movable covering body
20 Covering body drive unit
21 Arm (locking mechanism)
23 Helical extension spring
25 Stopper (locking mechanism)
27 L-shaped rod (unlocking mechanism)
28 Pressure receiving body (unlocking mechanism)
F Paint (paint layer)
LE Leading edge portion
S Metal sheath
Sr Lateral edge portion of the metal sheath
Ta Exposed adhesive portion (boundary portion)
V Guide vane (vane)
Va Vane body (vane body)
Vd Vane surface

The invention claimed is:

1. A coating apparatus for a vane which is equipped with a metal sheath for covering a leading edge portion of a vane body, the coating apparatus comprising:
   a jig which supports the vane;
   a nozzle which sprays paint onto a vane surface of the vane body except for the metal sheath of the vane supported by the jig;
   a robot which moves the nozzle; and
   a control unit,
   wherein the jig includes a movable covering body which covers the metal sheath by separably overlapping the metal sheath and covers a boundary portion between a lateral edge portion of the metal sheath and the vane surface of the vane body, and a covering body drive unit which moves the movable covering body,
   wherein the control unit controls a paint spraying operation of the nozzle and the robot, and the covering body drive unit such that the movable covering body moves between a covered state in which the movable covering body covers the metal sheath and the boundary portion and a separated state in which the movable covering body is separated from the metal sheath while covering the metal sheath and the boundary portion,
   wherein in a sheath cladding coating mode in which the paint is sprayed onto the entire vane surface of the vane body, the control unit controls the covering body drive unit to move the movable covering body to the state in which the movable covering body covers the metal sheath and the boundary portion,
   wherein in a finish coating mode in which the paint is sprayed over the movable covering body onto at least the boundary portion out of the lateral edge portion of the metal sheath and the boundary portion, the control unit controls the covering body drive unit to move the movable covering body to the state in which the movable covering body is separated from the metal sheath while covering the metal sheath and the boundary portion, and
   wherein the covering body drive unit includes a locking mechanism which maintains the covered state in which the metal sheath and the boundary portion are covered with the movable covering body, an unlocking mechanism which releases the covered state of the movable covering body created by the locking mechanism and separates the movable covering body from the metal sheath, and a helical extension spring which maintains the separated state between the movable covering body and the metal sheath by imparting a force in a direction of separating from the metal sheath to the movable covering body.

2. The coating apparatus for a vane according to claim 1, wherein the locking mechanism of the covering body drive unit includes a stopper which restricts separating motion of the movable covering body from the metal sheath in the covered state in which the metal sheath is covered, and the unlocking mechanism includes a pressure receiving body which operates by receiving the paint or air from the nozzle and thereby lifts the restriction imposed on the separating motion by the stopper of the locking mechanism.

* * * * *